United States Patent
Nakatani

(10) Patent No.: US 9,559,148 B2
(45) Date of Patent: Jan. 31, 2017

(54) SOLID-STATE IMAGING DEVICE AND IMAGING APPARATUS

(71) Applicant: FUJIFILM Corporation, Tokyo (JP)

(72) Inventor: Toshihiro Nakatani, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/861,099

(22) Filed: Sep. 22, 2015

(65) Prior Publication Data

US 2016/0013247 A1    Jan. 14, 2016

Related U.S. Application Data

(63) Continuation of application No. PCT/JP2014/001800, filed on Mar. 27, 2014.

(30) Foreign Application Priority Data

Mar. 29, 2013 (JP) .................................. 2013-073329
Jul. 24, 2013 (JP) .................................. 2013-153297

(51) Int. Cl.
*H01L 27/30* (2006.01)
*H01L 51/44* (2006.01)
*H01L 51/42* (2006.01)

(52) U.S. Cl.
CPC ......... *H01L 27/307* (2013.01); *H01L 51/4253* (2013.01); *H01L 51/4273* (2013.01); *H01L 51/441* (2013.01)

(58) Field of Classification Search
None
See application file for complete search history.

(56) References Cited

U.S. PATENT DOCUMENTS

| 4,739,384 A | 4/1988 | Higashi et al. |
| 2003/0057463 A1 | 3/2003 | Otabe et al. |
| 2003/0127647 A1 | 7/2003 | Street et al. |
| 2011/0049492 A1 | 3/2011 | Sawaki et al. |
| 2011/0074491 A1* | 3/2011 | Yofu ..................... B82Y 10/00 327/514 |

(Continued)

FOREIGN PATENT DOCUMENTS

| JP | S59-198781 A | 11/1984 |
| JP | S61-070873 A | 4/1986 |

(Continued)

OTHER PUBLICATIONS

International Search Report and Written Opinion, PCT/JP2014/001800, Aug. 12, 2014.

*Primary Examiner* — Joseph Schoenholtz
(74) *Attorney, Agent, or Firm* — Studebaker & Brackett PC

(57) ABSTRACT

A solid-state imaging device includes a plurality of pixel electrodes disposed two-dimensionally, an opposite electrode provided opposite to the pixel electrodes, and an organic layer formed of an organic material and provided between the pixel electrodes and the opposite electrode, in which a protrusion and recess section is formed on a surface of the organic layer on the opposite electrode side, and the protrusion and recess section includes a first protrusion and recess section formed at a position opposite to each pixel electrode and a second protrusion and recess section formed at a position opposite to the space between each pixel electrode.

15 Claims, 4 Drawing Sheets

(56) References Cited

U.S. PATENT DOCUMENTS

2013/0015435 A1* 1/2013 Sawaki .................. B82Y 10/00
                                                      257/40
2014/0042416 A1    2/2014 Imai
2014/0071316 A1    3/2014 Asano et al.

FOREIGN PATENT DOCUMENTS

| JP | S61-099369 A | 5/1986 |
| JP | H04-291964 A | 10/1992 |
| JP | H11-103041 A | 4/1999 |
| JP | 2002-237583 A | 8/2002 |
| JP | 2002-314121 A | 10/2002 |
| JP | 2003-075592 A | 3/2003 |
| JP | 2003-100993 A | 4/2003 |
| JP | 2003-209239 A | 7/2003 |
| JP | 2004-071483 A | 3/2004 |
| JP | 2008-072090 A | 3/2008 |
| JP | 2010-206128 A | 9/2010 |
| JP | 2011-071469 A | 4/2011 |
| JP | 2011-071483 A | 4/2011 |
| JP | 2012-227364 A | 11/2012 |
| JP | 2012-238774 A | 12/2012 |
| JP | 2013-183056 A | 9/2013 |
| JP | 2014-120628 A | 6/2014 |

* cited by examiner

FIG.4

| | SPACE BETWEEN PIXEL ELECTRODES | | PIXEL ELECTRODE CENTER | | BG TAPE PEELING TEST RESULTS | |
|---|---|---|---|---|---|---|
| | SHAPE | HEIGHT OF RECESS | SHAPE | HEIGHT OF RECESS | RATIO OF PEELING | JUDGEMENT |
| EXAMPLE 1 | RECESS | 0.5 | RECESS | 0.5 | 0.09 | GOOD |
| EXAMPLE 2 | RECESS | 2 | RECESS | 2 | 0.08 | GOOD |
| COMPARATIVE EXAMPLE 1 | RECESS | 0.5 | FLAT | 0 | 0.11 | POOR |
| COMPARATIVE EXAMPLE 2 | FLAT | 0 | FLAT | 0 | 0.12 | POOR |

FIG.5

| | PIXEL ELECTRODE CENTER PROTRUSION OR RECESS | | DEVICE PERFORMANCE | ADDITION OR NON-ADDITION OF PROCESS | JUDGEMENT |
|---|---|---|---|---|---|
| | FORMING POSITION | MAXIMUM INCLINATION ANGLE | | | |
| EXAMPLE 3 | PIXEL ELECTRODE SURFACE | θ≤50° | FAVORABLE | ADDITION | GOOD |
| EXAMPLE 4 | VIA SURFACE | θ≤50° | FAVORABLE | NON-ADDITION | EXCELLENT |
| COMPARATIVE EXAMPLE 3 | PIXEL ELECTRODE SURFACE | θ>50° | DEGRADED | ADDITION | POOR |

SOLID-STATE IMAGING DEVICE AND IMAGING APPARATUS

CROSS-REFERENCE TO RELATED APPLICATIONS

This application is a Continuation of PCT International Application No. PCT/JP2014/001800 filed on Mar. 27, 2014, which claims priority under 35 U.S.C. §119 (a) to Japanese Patent Application No. 2013-073329 filed on Mar. 29, 2013 and Japanese Patent Application No. 2013-153297 filed on Jul. 24, 2013. Each of the above applications is hereby expressly incorporated by reference, in its entirety, into the present application.

BACKGROUND

The present disclosure relates to a solid-state imaging device having an organic layer formed of an organic material between a plurality of pixel electrodes and an opposite electrode, and an imaging apparatus provided with the solid-state imaging device.

Heretofore, solid-state imaging devices, including CCD sensors and CMOS sensors, have been widely known as image sensors used in digital still cameras, digital video cameras, cell-phone cameras, endoscope cameras, and the like.

As such a solid-state imaging device, the present applicants have been developing a solid-state imaging device having an organic layer formed of an organic compound (refer to Japanese Unexamined Patent Publication No. 2011-071469, Japanese Unexamined Patent Publication No. 2011-071483, and Japanese Unexamined Patent Publication No. 2012-238774). The solid-state imaging device having an organic layer basically has a structure in which a pixel electrode, an organic layer, and an opposite electrode are layered in this order.

SUMMARY

In the process of manufacturing a solid-state imaging device, back grinding to grind the rear surface of the substrate is performed to reduce the thickness of the solid-state imaging device.

During back grinding or when a back grind tape is peeled off after the back grinding, there is a problem that peeling is likely to occur at the interface between the organic layer and the opposite electrode, whereby the yield rate is reduced.

Japanese Unexamined Patent Publication No. 2011-071469 discloses that the adhesion between the pixel electrode and the organic layer is improved by inclining an end portion of the pixel electrode to 10° to 70°. But nothing is disclosed about the peeling at the interface between the organic layer and the opposite electrode. Likewise, Japanese Unexamined Patent Publication No. 2002-314121 and Japanese Unexamined Patent Publication No. 2002-237583 disclose nothing about the peeling at the interface between the organic layer and the opposite electrode.

In view of the circumstances described above, the present disclosure provides a solid-state imaging device capable of preventing the peeling at the interface between the organic layer and the opposite electrode, and improving the yield rate, and an imaging apparatus provided with the solid-state imaging device.

A solid-state imaging device of the present disclosure includes a plurality of pixel electrodes disposed two-dimensionally on a substrate, an opposite electrode provided opposite to the pixel electrodes, and an organic layer formed of an organic material and provided between the pixel electrodes and the opposite electrode, in which a protrusion and recess section is formed on a surface of the organic layer on the opposite electrode side, and the protrusion and recess section includes a first protrusion and recess section formed at a position opposite to each pixel electrode, and a second protrusion and recess section formed at a position opposite to the space between each pixel electrode.

Here, the aforementioned "protrusion and recess section" refers to a structure having at least one pair of relatively high and low portions.

In the solid-state imaging device of the present disclosure described above, if the width of each pixel electrode is taken as 1, a protrusion or a recess on the surface of the organic layer may have a width "a" that satisfies $1/50 < a < 1$.

Further, a third protrusion and recess section corresponding to the first protrusion and recess section may be formed on the surface of each pixel electrode, and a fourth protrusion and recess section corresponding to the second protrusion and recess section may be formed on the same plane as the surface of each pixel electrode at a position between each pixel electrode.

Still further, a fifth protrusion and recess section corresponding to the first protrusion and recess section may be formed on a contact surface of a via, which is connected to a rear surface of each corresponding pixel electrode, with the pixel electrode.

Further, a step is formed between a surface of a via, which is connected to a rear surface of each corresponding pixel electrode, on the pixel electrode side and a surface of a layer within which the via is formed and on which the pixel electrode is formed.

Still further, a maximum inclination angle of the protrusion and recess section with respect to the plane of the substrate may be less than or equal to 50°.

Further, each pixel electrode may have an inclined surface on a peripheral portion.

Still further, the organic layer may be a deposited film.

Further, the organic layer may be uniformly formed on the plurality of pixel electrodes.

Further, the organic layer may include a photoelectric conversion layer that generates a change according to light received and an electron blocking layer that blocks injection of an electron into the photoelectric conversion layer from each pixel electrode, layered on top of each other.

An imaging apparatus of the present disclosure is provided with the foregoing solid-state imaging device of the present disclosure.

According to the solid-state imaging device of the present disclosure, in a solid-state imaging device which includes a plurality of pixel electrodes disposed two-dimensionally on a substrate, an opposite electrode provided opposite to the pixel electrodes, and an organic layer formed of an organic material and provided between the pixel electrodes and the opposite electrode, a protrusion and recess section is formed on a surface of the organic layer on the opposite electrode side, and the protrusion and recess section includes a first protrusion and recess section formed at a position opposite to each pixel electrode, and a second protrusion and recess section formed at a position opposite to the space between each pixel electrode. This may prevent peeling at the interface between the organic layer and the opposite electrode and improve the yield rate.

BRIEF DESCRIPTION OF THE DRAWINGS

FIG. 4 is a table showing evaluation results of peeling with respect to the height of a protrusion and a recess section.

FIG. 5 is a table showing evaluation results of device performance with respect to the maximum angle of inclination of a protrusion and a recess section.

DETAILED DESCRIPTION OF THE PREFERRED EMBODIMENTS

Figure 1:
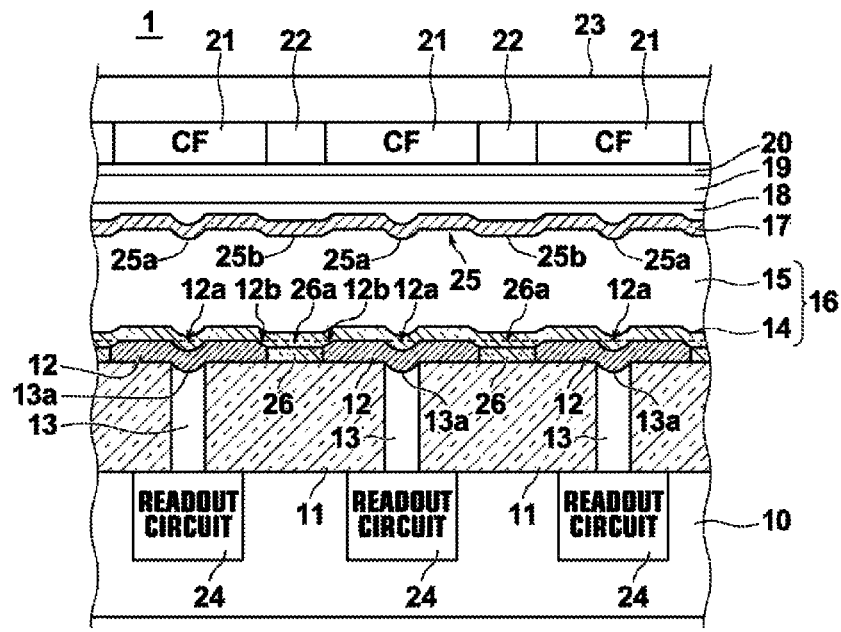
FIG. 1 is a schematic cross-sectional view of a solid-state imaging device according to one embodiment of the present disclosure.

Hereinafter, one embodiment of the solid-state imaging device of the present disclosure will be described with reference to the accompanying drawings. FIG. 1 is a schematic cross-sectional view of one embodiment of the solid-state imaging device of the present disclosure.

As shown in FIG. 1, a solid-state imaging device 1 of the present embodiment includes a substrate 10, an insulating layer 11, a plurality of pixel electrodes 12, a via 13, an organic layer 16, an opposite electrode 17, a buffer layer 18, a sealing layer 19, an sealing auxiliary layer 20, a color filter (CF) 21, a partition wall 22, a protection layer 23, and a signal readout circuit 24.

The substrate 10 is a glass substrate or a semiconductor substrate, such as silicon or the like. The insulating layer 11 is formed on the substrate 10. A plurality of pixel electrodes 12 is formed on the insulating layer 11. The plurality of pixel electrodes 12 is provided two-dimensionally on the substrate 10.

The organic layer 16 includes an electron blocking layer 14 and a photoelectric conversion layer 15 layered in this order. The electron blocking layer 14 is a layer that blocks injection of electrons to the photoelectric conversion layer 15 from the pixel electrodes 12 and is formed so as to cover the pixel electrodes 12. The photoelectric conversion layer 15 is formed of a photoelectric conversion material that generates charges according to light received. Note that the organic layer 16 is not limited to the layer configuration of the electron blocking layer 14 and the photoelectric conversion layer 15, and may be formed of a plurality of organic layers, including at least the photoelectric conversion layer 15.

The opposite electrode 17 is an electrode opposed to each pixel electrode 12 and provided on the organic layer 16. The opposite electrode 17 is formed of a conductive material transparent to incident light to allow light to incident on the organic layer 16. A predetermined voltage can be applied to the opposite electrode 17 via a wiring (not shown). This allows an electric field to be applied between the opposite electrode 17 and a plurality of pixel electrodes 12.

A photoelectric conversion element is composed of a pair of electrodes formed of each pixel electrode 12 and the opposite electrode 17 above each pixel electrode 12, and the organic layer 16 disposed between these electrodes.

The pixel electrode 12 is a charge collection electrode for collecting charges generated in the photoelectric conversion layer 15. A signal readout circuit 24 is provided for each of a plurality of pixel electrodes 12, and outputs a signal according to charges collected by a corresponding pixel electrode 12. The signal readout circuit 24 is, for example, a CCD, a MOS transistor circuit (MOS circuit), a TFT circuit, or the like. A via 13 electrically connects a pixel electrode 12 with a corresponding signal readout circuit 24 and embedded in the insulating layer 11. The via 13 is made of a conductive material such as tungsten (W) or the like.

Then, protrusion and recess sections 25 are formed on the surface of the organic layer 16 on the side of the opposite electrode 17, i.e., on the surface of the photoelectric conversion layer 15. The formation of the protrusion and recess sections 25 on the surface of the organic layer 16 may prevent peeling of the opposite electrode 17 from the photoelectric conversion layer 15 during the back grinding as described above.

A protrusion and recess section 25 of the organic layer 16 includes a first protrusion and recess section 25a formed at a position opposite to a pixel electrode 12 and a second protrusion and recess section 25b formed at a position opposite to the space between pixel electrodes.

The solid-state imaging device 1 includes the substrate 10 on which each layer is formed in order from the insulating layer 11 toward the upper layer, and the protrusion and recess sections 25 of the organic layer 16 are formed using this manufacturing method.

More specifically, when forming a via 13, a fifth protrusion and recess section 13a is formed. As for the method of forming the fifth protrusion and recess section 13a, a method described, for example, in Japanese Unexamined Patent Publication No. 2004-071483 may be used. More specifically, the fifth protrusion and recess section 13a may be formed by excessively grinding the via 13 than the insulating layer 11 when planarizing the surfaces of the via 13 and the insulating layer 11. Note that, in this case, a recess is formed at a contact surface of via 13 with the pixel electrode but a protrusion may be formed. In this case, a fifth protrusion and recess section 13a composed of a protrusion may be formed by excessively grinding the insulating layer to leave the surface of the via 13.

Next, pixel electrodes 12 are formed on the surfaces of the insulating layer 11 and the vias 13. More specifically, the pixel electrodes 12 are formed by uniformly depositing a conductive material, such as titanium nitride, on the surfaces of the insulating layer 11 and the vias 13 by CVD, and performing a photolithography process and an etching process. A third protrusion and recess section 12a is formed on the surface of each pixel electrode 12 by reflecting the fifth protrusion and recess section 13a of the via 13.

Then, after the pixel electrodes 12 are formed, an insulating layer is formed on the pixel electrodes 12. Then, an insulating layer 26 may be formed between pixel electrodes 12 by grinding the insulating layer until the surfaces of the pixel electrodes appear. At this time, a fourth protrusion and recess section 26a may be formed by excessively grinding the insulating layer 26 surrounding the pixel electrode 12. Note that an angulated portion at the periphery of the pixel electrode 12 is preferably ground to form an inclined surface 12b. The formation of such inclined surface results in a smooth protrusion and recess section, as illustrated in FIG. 1. At this time, a recess is formed between the pixel electrodes 12, but a protrusion may be formed. In this case, the fourth protrusion and recess section 26a composed of a protrusion may be formed by excessively grinding the pixel electrodes 12 to leave the surface of the insulating layer 26.

Then, after the third protrusion and recess sections 12a on the pixel electrodes 12 and the fourth protrusion and recess sections 26a between the pixel electrodes 12 are formed in the manner described above, the electron blocking layer 14 and the photoelectric conversion layer 15 are formed in this order by deposition. Therefore, the first protrusion and recess sections 25a are formed by reflecting the shapes of the third protrusion and recess sections 12a on the pixel electrodes 12 on the surfaces of the electron blocking layer 14 and the photoelectric conversion layer 15, while the second protrusion and recess sections 25b are formed by reflecting the shapes of the fourth protrusion and recess sections 26a between the pixel electrodes 12 on the surfaces of the electron blocking layer 14 and the photoelectric conversion layer 15.

In a case where the third protrusion and recess sections 12a on the pixel electrodes 12 and the first protrusion and recess sections 25a on the surface of the photoelectric conversion layer 15 are formed using the fifth protrusion and recess sections 13a formed on the vias 13, while the second protrusion and recess sections 25b on the surface of the photoelectric conversion layer 15 are formed using the fourth protrusion and recess sections 26a formed between the pixel electrodes 12, as in the present embodiment, the first protrusion and recess sections 25a and the second protrusion and recess sections 25b may be formed on the organic layer 16 by the existing working process without adding a new working process.

Note that, however, instead of forming a third protrusion and recess section 12a on a pixel electrode 12 using a fifth protrusion and recess section 13a of a via 13, as in the present embodiment, the third protrusion and recess section 12a may be formed by directly performing photolithography on the pixel electrode 12. In this case, a plurality of recesses or protrusions may be formed.

Further, the first protrusion and recess sections 25a and the second protrusion and recess sections 25b on the surface of the photoelectric conversion layer 15 are not necessarily formed using an underlying layer pattern as described above, and the first protrusion and recess sections 25a and the second protrusion and recess sections 25b may be formed by directly performing photolithography on the surface of the photoelectric conversion layer 15. In a case where the photolithography is performed directly on the surface of the photoelectric conversion layer 15, however, the properties of the photoelectric conversion layer 15 may possibly be changed and device performance, including the optical response speed, photoelectrical conversion efficiency (sensitivity), dark current, and the like, may possibly be degraded, so that the first protrusion and recess sections 25a and the second protrusion and recess sections 25b are preferably formed using the underlying layer patterns, as described above.

Conditions on the shape of a protrusion and recess section 25 formed on the surface of the photoelectric conversion layer 15 will now be described with reference to FIGS. 2 and 3.

First, a width "a" of a protrusion or a recess constituting the protrusion and recess section 25 on the surface of the photoelectric conversion layer 15 preferably satisfies $1/50 < a < 1$, if the width of the pixel electrode 12 is taken as 1. The reason is that if the width "a" is set to a value less than or equal to $1/50$, the adhesion of the interface cannot be enhanced sufficiently and a peeling prevention effect cannot almost be obtained. On the other hand, if the width "a" is set to a value greater than or equal to 1, the adhesion of the interface is enhanced, but this means that a protrusion and recess section greater than or equal to the width of the pixel electrode 12 will be formed on the photoelectric conversion layer 15, which is difficult to achieve without degrading the device performance.

Figure 2:
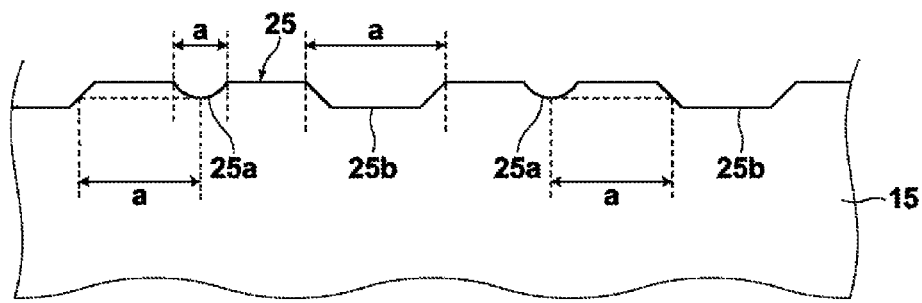
FIG. 2 is a drawing for explaining a width of a protrusion and a recess section on the surface of an organic layer.
Figure 3:
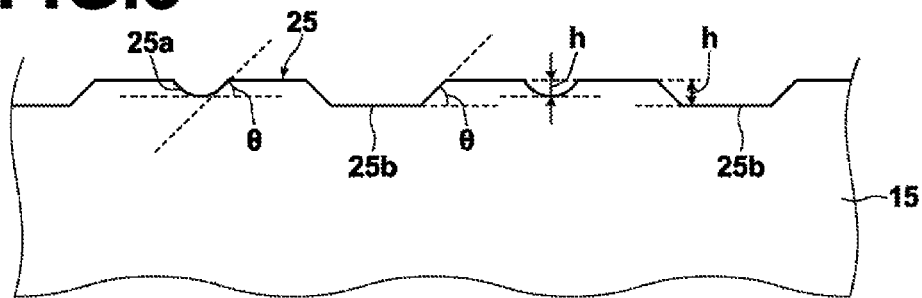
FIG. 3 is a drawing for explaining a height and a maximum angle of inclination of a protrusion and a recess section on the surface of an organic layer.

As illustrated in FIG. 2, the width of a recess refers to the largest opening width in cross-section parallel to the plane of the substrate, in which, if the cross-section is circular, the width refers to the diameter of the opening, while if the cross-section is not circular, the width refers to the smallest width of the opening in the cross-section. The width of a protrusion refers to the largest width of the protrusion in cross-section parallel to the plane of the substrate, in which, if the cross-section is circular, the width refers to the diameter of the protrusion, while if the cross-section is not circular, width refers to the smallest width of the protrusion in the cross-section.

Next, a height "h" of the protrusion and recess section 25 of the photoelectric conversion layer 15 is preferably greater than or equal to 0.5 nm for sufficiently preventing the opposite electrode 17 from peeling off from the photoelectric conversion layer 15. The table in FIG. 4 shows evaluation results of peeling to prove this. Note that the height "h" of the protrusion and recess section 25 of the photoelectric conversion layer 15 is, in actuality, adjusted by controlling the heights of the fifth protrusion and recess section 13a formed on the via 13 and the fourth protrusion and recess section 26a formed between the pixel electrodes 12. The height of the protrusion and recess section 25 refers to the height from the lowest surface to the highest surface in each protrusion or recess of the protrusion and recess sections 25 formed over the entire surface of the photoelectric conversion layer 15, as illustrated in FIG. 3.

Further, here, the pixel electrode material was titanium nitride, the size of the pixel electrode 12 was 3 μm square and the thickness was 30 nm. Further, the maximum inclination angle of an end face of each pixel electrode 12 formed with the substrate plane was 30° and the space between pixel electrodes 12 was 0.2 μm. An electron blocking layer 14 represented by a chemical formula 1 below was deposited on the pixel electrodes 12 with a thickness of 100 nm. Thereafter, a photoelectric conversion layer 15 was formed through co-evaporation of compounds represented by chemical formulae 2 and 3 below with a total thickness of 400 nm. The first protrusion and recess sections 25a were formed using fifth protrusion and recess sections 13a of the vias 13 and the diameter of the vias was 600 nm. Thereafter, an ITO film was formed by sputtering with a thickness of 10 nm, as the opposite electrode 17, an aluminum oxide film was formed by atomic layer deposition with a thickness of 30 nm, as the sealing layer 19, and a silicon nitride oxide film was formed by plasma CVD with a thickness of 300 nm, as the sealing auxiliary layer 20.

(Chemical Formula 1)

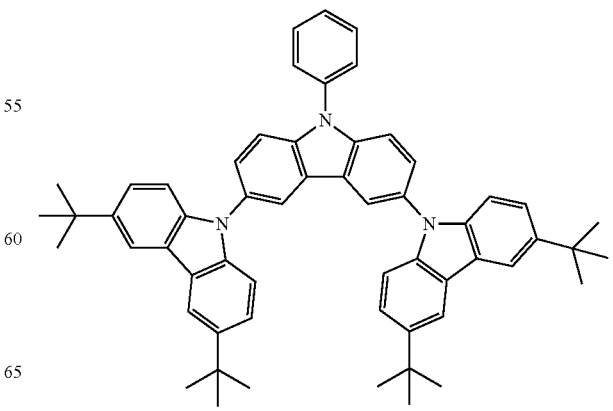

-continued (Chemical Formula 2)

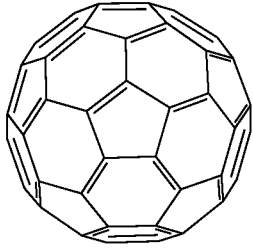

(Chemical Formula 3)

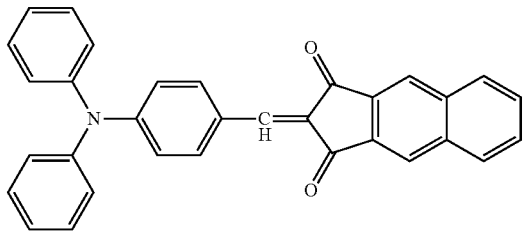

In Example 1, the first protrusion and recess section 25a was formed at a position corresponding to the center of each pixel electrode 12, and the second protrusion and recess section 25b was formed at a position corresponding to the space between each pixel electrode 12, with a height "h" of 0.5 nm. The width "a" of the protrusion and the recess constituting the protrusion and recess section 25 satisfies the condition, $1/50<a<1$. That is, the width "a" of the protrusion and the recess constituting the protrusion and recess section 25 is greater than 60 nm and less than 3 μm. After completing the back grinding and peeling off the back grind tape (BGE-194U, manufactured by DENKA), peeling evaluation was conducted by calculating the ratio of the number of photoelectric conversion elements in which peeling occurred at the interface between the organic layer and the opposite electrode to the number of all the photoelectric conversion elements. If the foregoing ratio is less than 0.1, the evaluation was determined as "good", while if the ratio is greater than or equal to 0.1, the evaluation was determined as "poor". For Example 1, the ratio of photoelectric conversion elements in which peeling occurred was 0.09 and the peeling evaluation was "good".

In Example 2, the first protrusion and recess section 25a was formed at a position corresponding to the center of each pixel electrode 12, and the second protrusion and recess section 25b was formed at a position corresponding to the space between each pixel electrode 12, with a height "h" of 2 nm. The width "a" of the protrusion and the recess constituting the protrusion and recess section 25 satisfies the condition, $1/50<a<1$. That is, the width "a" of the protrusion and the recess constituting the protrusion and recess section 25 is greater than 60 nm and less than 3 μm. For Example 2, the ratio of photoelectric conversion elements in which peeling occurred was 0.08 and the peeling evaluation was "good".

In Comparative Example 1, the second protrusion and recess section 25b was formed at a position corresponding to the space between each pixel electrode 12, with a height "h" of 0.5 nm, without forming the first protrusion and recess section 25a at a position corresponding to the center of each pixel electrode 12. The width "a" of the protrusion and the recess constituting the protrusion and recess section 25 satisfies the condition, $1/50<a<1$. That is, the width "a" of the protrusion and the recess constituting the protrusion and recess section 25 is greater than 60 nm and less than 3 μm. For Comparative Example 1, the ratio of photoelectric conversion elements in which peeling occurred was 0.11 and the peeling evaluation was "poor".

In Comparative Example 2, neither the first protrusion and recess section 25a nor the second protrusion and recess section 25b was formed. That is, the surface of the photoelectric conversion layer 15 was flat in Comparative Example 2. For Comparative Example 2, the ratio of photoelectric conversion elements in which peeling occurred was 0.12 and the peeling evaluation was "poor".

It is known from the evaluation results shown in FIG. 4 that the height "h" of the protrusion and recess section 25 of the photoelectric conversion layer 15 is preferably greater than or equal to 0.5 nm, and more preferably greater than or equal to 2 nm. It is also known that forming only the second protrusion and recess section 25b without forming the first protrusion and recess section 25a causes insufficient adhesion, and forming both the first protrusion and recess section 25a and the second protrusion and recess section 25b is suitable to prevent peeling.

But an excessively increased height of the protrusion and recess section 25 leads to stress concentration and field concentration when the photoelectric conversion element is driven, and may cause problems, such as an increase in dark current. Therefore, the height of the protrusion and recess section 25 of the photoelectric conversion layer 15 is preferably less than or equal to 20 nm and more preferably less than or equal to 10 nm.

If the maximum inclination angle of the protrusion and recess section 25 is tried to increase greater than 50°, a crack occurs in the organic layer 16 when deposited, and dark current may possibly be increased due to the peeling of the organic layer 16 and field concentration. Therefore, the maximum inclination angle of the protrusion and recess section 25 is preferably less than or equal to 50°, more preferably less than or equal to 40°, and further preferably less than or equal to 30°. FIG. 5 shows evaluation results of device performance to prove this. More specifically, the device performance was evaluated by measuring dark current. The maximum inclination angle refers to a maximum angle of inclination angles θ formed between the substrate plane and an osculating plane at any point of the protrusion and recess section 25, as illustrated in FIG. 3.

For the maximum inclination angle of the first protrusion and recess section 25a corresponding to the center of the pixel electrode 12, the evaluation was carried out in two cases, one of which is that the first protrusion and recess section 25a was formed using the fifth protrusion and recess section 13a formed on the via 13 as in the embodiment shown in FIG. 1, and the other of which is that the first protrusion and recess section 25a was formed using the third protrusion and recess section 12a formed directly on the pixel electrode 12 without forming the fifth protrusion and recess section 13a on the via 13.

Note that the maximum inclination angle of the protrusion and recess section 25 of the photoelectric conversion layer 15 is, in actuality, adjusted by controlling the inclinations of the fifth protrusion and recess section 13a formed on the via 13, the third protrusion and recess section 12a formed directly on the pixel electrode 12, and the fourth protrusion and recess section 26a formed between the pixel electrodes 12.

In Example 3, the first protrusion and recess section 25a was formed using the third protrusion and recess section 12a formed directly on the pixel electrode 12, with the maximum inclination angle of the protrusion and recess section 25 being set to less than or equal to 50°. In the case of Example 3, the device performance was good.

In Example 4, the first protrusion and recess section 25a was formed using the fifth protrusion and recess section 13a formed on the via 13, with the maximum inclination angle of the protrusion and recess section 25 being set to less than or equal to 50°. In the case of Example 4, the device performance was favorable as in Example 3. Further, the overall judgment for Example 4 can be said to be "excellent" while that of Example 3 is "good" on grounds that Example 4 does not require a new working process to be added in comparison with Example 3.

In Comparative Example 3, the first protrusion and recess section 25a was formed using the third protrusion and recess section 12a formed directly on the pixel electrode 12, with the maximum inclination angle of the protrusion and recess section 25 being set to greater than 50°. In the case of Comparative Example 3, the device performance was degraded. The overall judgement for Comparative Example 3 can be said to be "poor" also on grounds that Comparative Example 3 requires a new working process to be added.

It is known from the evaluation results shown in FIG. 5 that the maximum inclination angle of the protrusion and recess section 25 of the photoelectric conversion layer 15 is preferably less than or equal to 50°.

Figure 6:
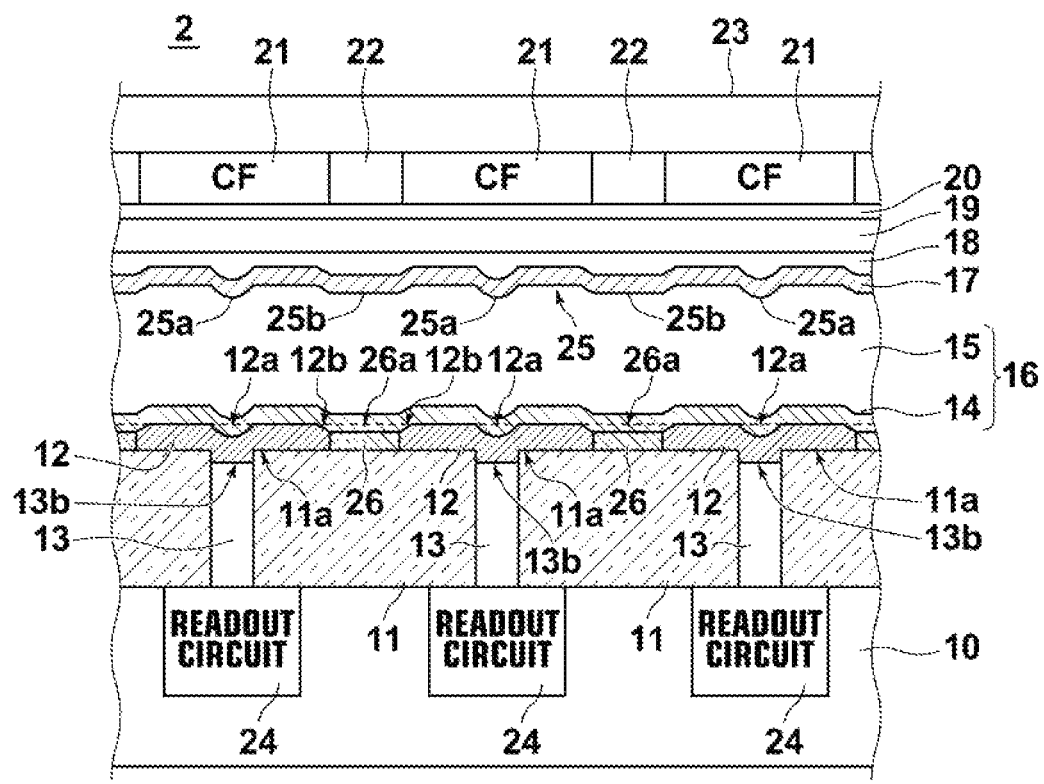
FIG. 6 is a cross-sectional view of a modification of the solid-state imaging device according to one embodiment of the present disclosure.

In the foregoing embodiment, the first protrusion and recess section 25a is formed using the fifth protrusion and recess section 13a on the surface of the via 13, but not limited to this and, for example, the first protrusion and recess section 25a may be formed by forming the via 13 within the insulating layer to create a step between a surface 13b of the via 13 on the pixel electrode side and a surface 11a of the insulating layer on which the pixel electrode 12 is formed, as in a solid-state imaging device 2 shown in FIG. 6. Further, the surface 13b of the via 13 is made lower than the surface 11a of the insulating layer in FIG. 6, but contrary to this, the surface 13b of the via 13 is made higher than the surface 11a of the insulating layer 11.

Next, the electron blocking layer 14 and the photoelectric conversion layer 15 of the organic layer 16 will be described further.

As described above, the electron blocking layer 14 is a layer for preventing electrons from being injected from the pixel electrodes 12 to the photoelectric conversion layer 15 and is composed of a single layer or a plurality of layers. The electron blocking layer 14 is preferably made of a material having a high barrier against electron injection from adjacent pixel electrodes 12 and high hole transporting properties. As for the electron injection barrier, the electron affinity of the electron blocking layer 14 is preferably smaller than the work function of the pixel electrode 12 adjacent to the electron blocking layer 14 by 1 eV or more. The electron affinity of the electron blocking layer 14 is more preferably smaller than the work function of the pixel electrode 12 by 1.3 eV or more, and particularly preferably smaller by 1.5 eV or more. The electron blocking layer 14 is preferably greater than or equal to 20 nm, more preferably greater than or equal to 40 nm, and particularly preferably greater than or equal to 60 nm in order to sufficiently inhibit the contact between the pixel electrodes 12 and the photoelectric conversion layer 15 and to avoid influence of defects or foreign particles present on the surfaces of the pixel electrodes 12.

If the electron blocking layer 14 is formed too thick, problems that the supply voltage required to apply an appropriate electric field intensity to the photoelectric conversion layer 15 is increased and a carrier transport process in the electron blocking layer 14 gives adverse effects to the performance of the photoelectric conversion device. Therefore, the total film thickness of the electron blocking layer 14 is preferably less than or equal to 300 nm, more preferably less than or equal to 200 nm, and further preferably less than or equal to 100 nm.

An electron donating organic material may be used for the electron blocking layer 14. More specifically, low molecular weight materials include aromatic diamine compounds, such as N, N'-diphenyl-N, N'-bis(3-methylphenyl)-(1,1'-biphenyl)-4,4'-diamine (TPD), 4,4'-bis [N-(naphthyl)-N-phenylamino]biphenyl (α-NPD), and the like, porphyrin compounds, such as, oxazole, oxadiazole, triazole, imidazole, imidazolone, stilbene derivatives, pyrazoline derivatives, tetrahydroimidazole, polyarylalkane, butadiene, 4,4', 4"-tris (N-(3-methylphenyl)N-phenylamino)triphenylamine (m-MTDATA), porphine, tetraphenylporphine copper, phthalocyanine, copper phthalocyanine, titanium phthalocyanine oxide, and the like, triazole derivatives, oxadiazole derivatives, imidazole derivatives, polyarylalkane derivatives, pyrazoline derivatives, pyrazolone derivatives, phenylenediamine derivatives, arylamine derivatives, fluorene derivatives, amino-substituted chalcone derivatives, oxazole derivatives, styryl anthracene derivatives, fluorenone derivatives, hydrazone derivatives, silazane derivatives, and the like, while polymeric materials include polymers, such as phenylene vinylene, fluorene, carbazole, indole, pyrene, pyrrole, picoline, thiophene, acetylene, diacetylene, and the like, and their derivatives. Even a non-electron donating compound may be used as long as it has a sufficient hole transporting property. More specifically, for example, the compounds described in Japanese Unexamined Patent Publication No. 2008-072090 and the like may preferably be used.

As for the electron blocking layer 14, inorganic materials may also be used. Generally, inorganic materials have a higher dielectric constant than that of organic materials, and the use of an inorganic material for the electron blocking layer 14 causes more voltage to be applied to the photoelectric conversion layer 15 and the photoelectric conversion efficiency (sensitivity) may be increased. Materials that can be the electron blocking layer 14 include calcium oxide, chromium oxide, chromium oxide copper, manganese oxide, cobalt oxide, nickel oxide, copper oxide, gallium oxide copper, strontium oxide copper, niobium oxide, molybdenum oxide, indium oxide copper, indium oxide silver, iridium oxide, and the like.

The photoelectric conversion layer 15 receives light and generates charges according to the amount of light received, and includes an organic photoelectric conversion material.

The photoelectric conversion layer 15 is preferably a layer that includes a p-type organic semiconductor or an n-type organic semiconductor, and more preferably a layer that includes a bulk hetero layer (mixed layer) of a p-type organic compound semiconductor and an n-type organic compound semiconductor mixed together in at least a portion thereof. The use of the bulk hetero layer as the photoelectric conversion layer allows the photoelectric conversion efficiency (sensitivity) to be improved. By producing a bulk hetero layer with an optimum mixing ratio, the electron mobility and the hole mobility of the photoelectric conversion layer may be increased, whereby the optical response speed of the photoelectric conversion layer may be increased.

Further, the photoelectric conversion layer 15 preferably includes a fullerene or a fullerene derivative as the n-type organic semiconductor. That is, the photoelectric conversion layer 15 is preferably a bulk hetero layer of a p-type organic compound semiconductor and a fullerene or a fullerene derivative mixed together. In a case where the photoelectric conversion layer 15 includes a fullerene or a fullerene derivative as the n-type organic semiconductor, peeling is likely to occur at the interface with the opposite electrode 17, and in such a case, the advantageous effect of the present disclosure is more significant.

The inclusion of a fullerene or a fullerene derivative causes molecules of the fullerene or fullerene derivative to be in a continuous state to form an electron path, whereby the electron transportability is improved and high speed responsiveness of the organic photoelectric conversion element may be realized by compensating for a drawback of short carrier diffusion length of the photoelectric conversion layer.

In the photoelectric conversion layer 15, an excessive amount of fullerene or fullerene derivative results in that the p-type organic semiconductor is decreased whereby the junction interface is reduced and the exciton dissociation efficiency is reduced, thereby resulting in a reduced absorption amount of incident light. The total amount of the fullerene and/or the fullerene derivative in the photoelectric conversion layer 32 is preferably 40 vol % to 85 vol %.

As for the p-type organic compound semiconductor, for example, triarylamine compounds, pyran compounds, quinacridone compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene derivatives, tetracene derivatives, pyrene derivatives, perylene derivatives, fluoranthene derivative) and metal complexes having a nitrogen-containing heterocyclic compound as a ligand may be used, in which triarylamine compounds, pyran compounds, quinacridone compounds, pyrrole compounds, phthalocyanine compounds, merocyanine compounds, and condensed aromatic carbocyclic compounds are preferable.

The material of the photoelectric conversion layer 15 preferably has a molecular weight of 400 to 1300. The reason is that, if the molecular weight is reduced to less than 400, crystallization is likely to occur and the adhesion of the opposite electrode 17 is reduced, and the adhesion of the opposite electrode 17 is also reduced if the molecular weight exceeds 1300. Generally, if the molecular weight of an organic compound in an organic layer is large, the glass transition point (Tg) rises and the heat resistance is improved, but an excessively large molecular weight causes a reduction in the adhesion to the under layer. This is because it is considered that a larger molecular weight causes the grain size to tend to increase, thereby reducing the contact with the under layer and the adhesion is aggravated.

As described above, the electron blocking layer 14 and the photoelectric conversion layer 15 are formed by deposition. It is preferable that all the process steps are performed in a vacuum during the film forming. Basically, it is preferable that the compound is prevented from directly contacting the oxygen and moisture in the ambient air. Such film forming method may be a vacuum deposition method. In the vacuum deposition method, it is preferable that the deposition speed is PI or PID controlled using a film thickness monitor, such as a crystal oscillator, an interferometer, and the like. In a case where two or more types of compounds are deposited at the same time, a co-deposition method may be used. The co-deposition is preferably performed using resistance heating evaporation, electron beam evaporation, flash evaporation, and the like.

Next, the opposite electrode 17 will be described.

The opposite electrode 17 is an electrode provided common to all photoelectric conversion elements on the organic layer 16. For increasing the absolute amount of light incident on the photoelectric conversion layer 15 and increasing the external quantum efficiency, a transparent conductive oxide is preferably used for the opposite electrode 17. One of the materials of ITO, IZO, $SnO_2$, ATO (antimony-doped tin oxide), ZnO, AZO (Al-doped zinc oxide), GZO (gallium-doped zinc oxide), $TiO_2$, FTO (fluorine-doped tin oxide) is preferably used for the opposite electrode 17. The use of ITO may result in that the peeling from the organic layer 16 is likely to occur, and the advantageous effect of the present disclosure is more significant.

The light transmission rate of the opposite electrode 17 is preferably greater than or equal to 60%, more preferably greater than or equal to 80%, further preferably greater than or equal to 90%, and still further preferably greater than or equal to 95% in the visible light wavelengths.

In a case where the signal readout circuit 24 is CMOS type, the surface resistance of the opposite electrode 17 is preferably less than or equal to 10 k$\Omega$/□ and more preferably less than or equal to 1 k$\Omega$/□. In a case where the signal readout circuit 24 is CCD type, the surface resistance is preferably less than or equal to 1 k$\Omega$/□ and more preferably less than or equal to 0.1 k$\Omega$/□.

Next, the buffer layer 18, the sealing layer 19, and the sealing auxiliary layer 20 will be described.

The buffer layer 18 is a layer for blocking factors that deteriorate the organic photoelectric conversion material, such as water molecules intruding through unavoidable small defects in the sealing layer 19 due to dust and the like during the manufacturing process by adsorbing and/or reacting, thereby preventing the deterioration factors from reaching the organic photoelectric conversion material lying thereunder. An example material that can be used for the buffer layer 18 is a silicon monoxide.

The sealing layer 19 is a layer for preventing deterioration of the photoelectric conversion layer over a long period of storage/use by blocking the intrusion of factors that deteriorate the photoelectric conversion material, such as water molecules, after the solid-state imaging device is manufactured. As incident light reaches the photoelectric conversion layer 15 through the sealing layer 19, the sealing layer 19 needs to be transparent to light of a wavelength detected by the photoelectric conversion layer 15. As for the sealing layer 19, aluminum oxide, silicon oxide, silicon nitride, silicon nitride oxide, a layered film of these, and a layered film of these and an organic polymer, and the like may be used.

The sealing auxiliary layer 20 is a layer for protecting the sealing layer 19. The sealing auxiliary layer 20 preferably includes any one of silicon oxide, silicon nitride, and silicon nitride oxide.

The color filter 21 is formed at a position corresponding to each pixel electrode 12. The partition wall 22 is provided between the color filters 21 to improve the light transmission efficiency of the color filter 21. The protection layer 23 is formed on the color filters 21 and partition walls 22 to protect the entire solid-state imaging device 1.

In the solid-state imaging device 1 formed in the manner described above, when light is incident, the light enters the photoelectric conversion layer 15 of the organic layer 16 and charges are generated therein. Holes of the generated charges are collected by each pixel electrode 12 and a voltage signal according to the collected amount is outputted outside the solid-state imaging device 1 by each signal readout circuit 24.

The solid-state imaging device of the foregoing embodiment may be used in various imaging apparatuses, including, for example, digital cameras, digital video cameras, electronic endoscope, and cell phones with cameras.

What is claimed is:

1. A solid-state imaging device, comprising a plurality of pixel electrodes disposed two-dimensionally on a substrate, an opposite electrode provided opposite to the pixel electrodes, and an organic layer formed of an organic material and provided between the pixel electrodes and the opposite electrode, wherein:
    a protrusion and recess section is formed on a surface of the organic layer on the opposite electrode side; and
    the protrusion and recess section includes a first protrusion and recess section formed at a position opposite to each pixel electrode, and a second protrusion and recess section formed at a position opposite to the space between each pixel electrode.

2. The solid-state imaging device of claim 1, wherein, if the width of each pixel electrode is taken as 1, a protrusion or a recess on the surface of the organic layer has a width "a" that satisfies $1/50 < a < 1$.

3. The solid-state imaging device of claim 1, wherein a third protrusion and recess section corresponding to the first protrusion and recess section is formed on the surface of each pixel electrode, and a fourth protrusion and recess section corresponding to the second protrusion and recess section is formed on the same plane as the surface of each pixel electrode at a position between each pixel electrode.

4. The solid-state imaging device of claim 1, wherein a fifth protrusion and recess section corresponding to the first protrusion and recess section is formed on a contact surface of a via, which is connected to a rear surface of each corresponding pixel electrode, with the pixel electrode.

5. The solid-state imaging device of claim 2, wherein a fifth protrusion and recess section corresponding to the first protrusion and recess section is formed on a contact surface of a via, which is connected to a rear surface of each corresponding pixel electrode, with the pixel electrode.

6. The solid-state imaging device of claim 3, wherein a fifth protrusion and recess section corresponding to the first protrusion and recess section is formed on a contact surface of a via, which is connected to a rear surface of each corresponding pixel electrode, with the pixel electrode.

7. The solid-state imaging device of claim 1, wherein a step is formed between a surface of a via, which is connected to a rear surface of each corresponding pixel electrode, on the pixel electrode side and a surface of a layer within which the via is formed and on which the pixel electrode is formed.

8. The solid-state imaging device of claim 2, wherein a step is formed between a surface of a via, which is connected to a rear surface of each corresponding pixel electrode, on the pixel electrode side and a surface of a layer within which the via is formed and on which the pixel electrode is formed.

9. The solid-state imaging device of claim 3, wherein a step is formed between a surface of a via, which is connected to a rear surface of each corresponding pixel electrode, on the pixel electrode side and a surface of a layer within which the via is formed and on which the pixel electrode is formed.

10. The solid-state imaging device of claim 1, wherein a maximum inclination angle of the protrusion and recess section with respect to the plane of the substrate is less than or equal to 50°.

11. The solid-state imaging device of claim 1, wherein each pixel electrode has an inclined surface on a peripheral portion.

12. The solid-state imaging device of claim 1, wherein the organic layer is a deposited film.

13. The solid-state imaging device of claim 1, wherein the organic layer is uniformly formed on the plurality of pixel electrodes.

14. The solid-state imaging device of claim 1, wherein the organic layer comprises a photoelectric conversion layer that generates a change according to light received and an electron blocking layer that blocks injection of an electron into the photoelectric conversion layer from each pixel electrode, layered on top of each other.

15. An imaging apparatus provided with the solid-state imaging device of claim 1.

* * * * *